US011735284B2

(12) United States Patent
Xie et al.

(10) Patent No.: US 11,735,284 B2
(45) Date of Patent: *Aug. 22, 2023

(54) OPTIMIZED SEASONING TRIM VALUES BASED ON FORM FACTORS IN MEMORY SUB-SYSTEM MANUFACTURING

(71) Applicant: Micron Technology, Inc., Boise, ID (US)

(72) Inventors: Tingjun Xie, Milpitas, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/961,193

(22) Filed: Oct. 6, 2022

(65) Prior Publication Data

US 2023/0062213 A1    Mar. 2, 2023

Related U.S. Application Data

(63) Continuation of application No. 17/465,020, filed on Sep. 2, 2021, now Pat. No. 11,495,316.

(51) Int. Cl.
*G11C 29/10* (2006.01)
(52) U.S. Cl.
CPC .................................. *G11C 29/10* (2013.01)
(58) Field of Classification Search
None
See application file for complete search history.

(56) References Cited

U.S. PATENT DOCUMENTS 5,878,050 A * 3/1999 Brahme ................. G06F 11/10
                                                         714/719
11,495,316 B1 * 11/2022 Xie ....................... G11C 29/021
(Continued)

FOREIGN PATENT DOCUMENTS

| KR | 20100097715 A | 9/2010 |
| WO | 2021111155 A1 | 6/2021 |

OTHER PUBLICATIONS

PCT Notification of Transmittal of the International Search Report and the Written Opinion of the International Searching Authority for PCT Application No. PCT/US2022/042270, dated Dec. 16, 2022, 9 pages.

*Primary Examiner* — April Y Blair
*Assistant Examiner* — Matthew W Wahlin
(74) *Attorney, Agent, or Firm* — Lowenstein Sandler LLP

(57) ABSTRACT

A system and method for optimizing seasoning trim values based on form factors in memory sub-system manufacturing. An example method includes selecting a baseline set of trim values based on a set of memory sub-system form factors; generating a first modified set of trim values for seasoning operations by modifying a first trim value of the baseline trim values; causing each memory sub-system of a plurality of memory sub-systems to perform seasoning operations using the first modified set of trim values; responsive to determining that a memory sub-system of the plurality of memory sub-system failed to satisfy a predetermined criterion, determining whether the memory sub-system is extrinsically defective; responsive to determining that the memory sub-system is extrinsically defective, removing the extrinsically defective memory sub-system from the set of memory sub-systems; and generating a second modified set of trim values for seasoning operations.

20 Claims, 5 Drawing Sheets

(56) References Cited

U.S. PATENT DOCUMENTS

| | | | |
|---|---|---|---|
| 2009/0168504 A1* | 7/2009 | Lee .................... | G11C 16/3431 |
| | | | 365/163 |
| 2011/0051507 A1* | 3/2011 | Sarkar ................ | G11C 13/0033 |
| | | | 711/E12.001 |
| 2015/0055409 A1 | 2/2015 | Karpov | |
| 2021/0065790 A1 | 3/2021 | Lang | |

* cited by examiner

OPTIMIZED SEASONING TRIM VALUES BASED ON FORM FACTORS IN MEMORY SUB-SYSTEM MANUFACTURING

RELATED APPLICATION

This application a continuation of U.S. patent application Ser. No. 17/465,020, filed Sep. 2, 2021, the entire contents of which is hereby incorporated by reference herein.

TECHNICAL FIELD

Embodiments of the present disclosure relate generally to a memory sub-system, and more specifically, relate to optimized seasoning trim values based on form factors in memory sub-system manufacturing.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
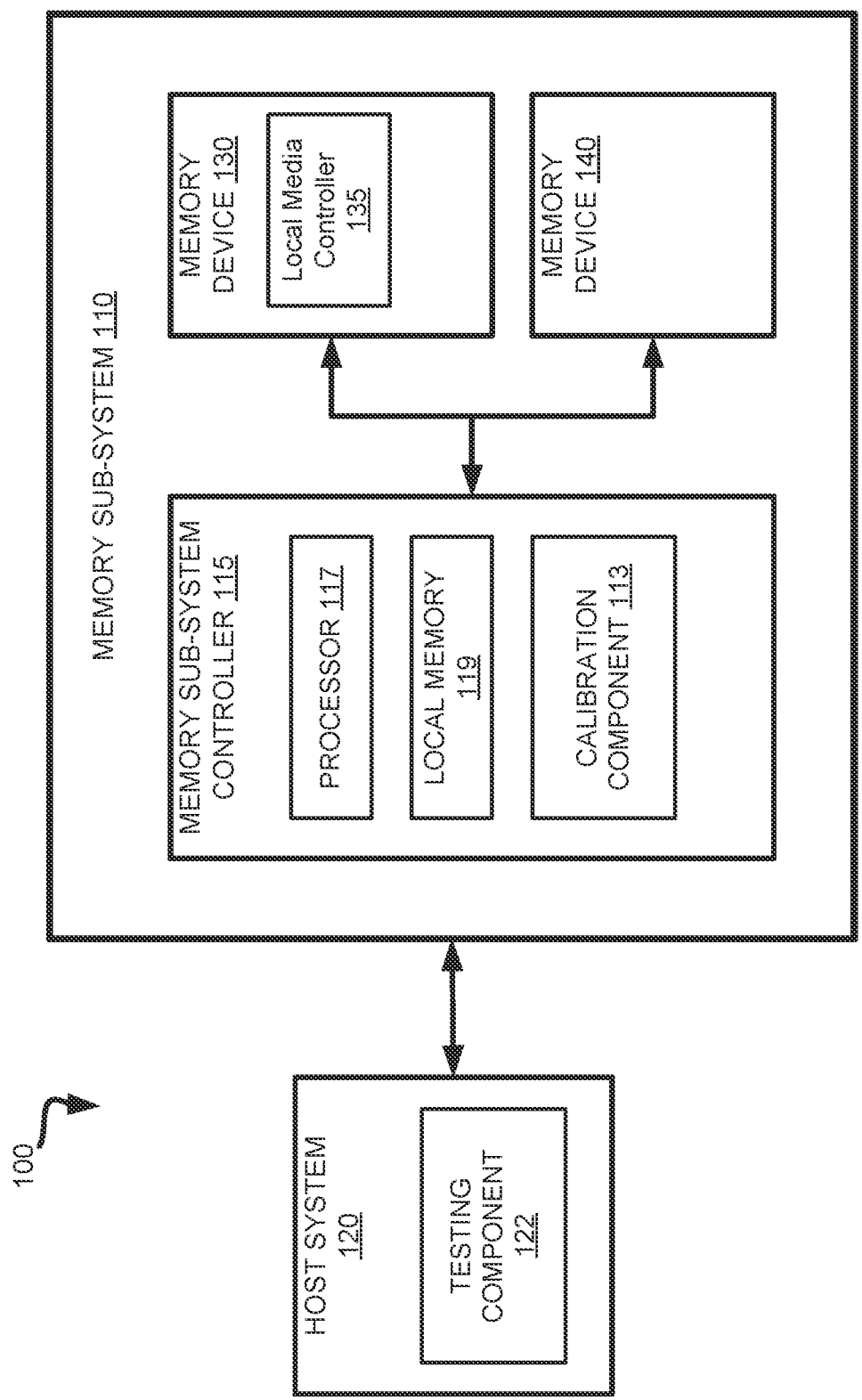
FIG. 1 illustrates an example computing system that includes a memory sub-system in accordance with some embodiments of the present disclosure.

Aspects of the present disclosure are directed to determining optimized seasoning trim values based on form factors in memory sub-system manufacturing. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be generally referred to as independent plane driver circuits. Depending on the storage architecture employed, data can be stored across the memory planes (i.e. in stripes). Accordingly, one request to read a segment of data (e.g., corresponding to one or more data addresses), can result in read operations performed on two or more of the memory planes of the memory device.

In some memory sub-systems, the variation in temperature and/or processing drift can negatively impact the reliability of memory devices. In particular, during assembly flow, the high temperature will cause the cells to land into a deviated status that have the SET and RESET Vt states shift higher, causing the read sensing points for normal operating status to be too high for the memory device after assembly flow. Thus, the excessive temperatures used during a heating process in the assembly flow can result in a higher error rate for the memory device during the operating lifetime of the memory sub-system.

For example, for a newly manufactured memory device, the set state (e.g., a lower voltage level associated with a bit value of '1') and reset state (e.g., a higher voltage level associated with a bit value of '0') for a memory cell can register higher than expected voltage levels with respect to a predefined threshold voltage ($V_t$) read level. As such, a memory cell of a memory device that was programmed to a set state, could be interpreted by a read operation as a higher voltage level indicative of a reset state. This misinterpretation, in turn, can result in a higher error rate due to the drift in observed voltage levels that can impact the representative voltage state of the affected memory cells. While a write operation is performed to program a memory cell to a set state, the voltage state of the memory cell could indicate differently in response to a read operation as a result of the voltage level drift.

Some memory sub-systems that are configured in this manner address the resulting reliability issues by performing repetitive cycles of specialized read or write operations on the memory device to stabilize the voltage levels of the memory cells. During these "seasoning" cycles, voltage pulses are applied to the memory device to stabilize the voltage levels of the memory cells to predetermined set and reset voltage states. For example, the memory sub-system controller can load, from a data structure, an identified set of voltage pulses to a register of a memory die to enable execution of the requested operation. Execution of the seasoning operations with respect to a memory die requires the use of values that can be adjusted or tuned to modify the behavior and characteristics of the memory dies (herein referred to as "trim values"). The trim values can specify different voltage pulse shapes (e.g., pulse magnitude, pulses width, etc.), intensity, duration, write-to write delay, the number of dies that can be concurrently active in the memory sub-system during the seasoning, etc.

However, seasoning a memory sub-system can be a time-consuming process. As such, manufactures may apply the same trim values when seasoning memory sub-systems having different form factors. Form factors specify the physical configurations of a memory device, such as, for example, the shape and size of the memory device, the type of connection interface used between the memory sub-system and the host system, power supply limits, memory space capacity, etc. However, this can negatively affect manufacturing throughput and memory sub-system quality. This is because the memory device of one set of form factors can have more stringent power or seasoning intensity limitations so the uniform seasoning process could possibly cause seasoning failure (e.g. device temperature exceeding required seasoning temperature limit, insufficient power supply causing abnormal seasoning behavior, etc.), while memory devices of another set of form factors can have more margin on power or seasoning intensity limitations so the uniform seasoning process does not fully utilize it and can yield an unsatisfactory seasoning duration or throughput). In particular, a certain set of format factors can have higher power limits and better ventilation conditions, allowing seasoning with a set of trim values with higher trim value intensities to maximize seasoning throughput. For other form factors, there can be more constraints on power and/or temperature so another set of trim value are optimal for the seasoning process.

Aspects of the present disclosure address the above-noted and other deficiencies by defining seasoning operations for different sets of form factors. The trim values for the seasoning operations can be generated using a calibration set of memory sub-systems having a particular set of form factors. For example, the memory sub-systems can each have the same particular power limit, the same particular shape and size, and the same particular memory space capacity. In some embodiments, an initial sub-set of the memory sub-systems can be selected to generate a tentative set of trim values for the memory devices having the particular set of form factors. Specifically, a host system can select, from a data structure, a predetermined baseline set of trim values that will not cause power related or temperature related failures in memory sub-systems having similar or the same form factors. The host system can then generate a modified set of trim values by increasing the intensity and/or duration of one or more of the baseline trim values. For example, the host system can increase the voltage value of the pulse applied to a die of a memory sub-system (e.g., apply a voltage pulse at a higher voltage than a baseline trim value), increase the duration of the voltage pulse, modify the number of dies that are be concurrently active (which may alter the internal temperature of the memory device), etc. The host system can then perform, using the modified trim values, a seasoning operation on each of the memory sub-systems of the initial set (e.g., the host system can send a command to perform a seasoning operation to each of the memory sub-systems). Responsive to receiving the seasoning operation command from the host system, each memory sub-system can load a sequence of the modified trim values to one or more registers of the memory sub-system and apply the modified trim values until the seasoning cycle criterion is satisfied (e.g., a threshold number of seasoning cycles have been completed). Each memory sub-system can then perform failure scanning that involve one or more tests for determining whether the memory device overheated during the seasoning process, failed to provide sufficient power to perform the seasoning operations, etc.

The host system can determine whether any of the memory sub-systems of the initial set failed the failure scanning operations (e.g., triggered or satisfied a predetermined criterion indicating an issue). Responsive to no memory sub-systems failing the failure scanning operations, the host system can further modify the trim values by increasing the intensity and/or duration of one or more of the baseline trim values or one or more of the previously modified trim values, and repeat the seasoning operations. Responsive to at least one memory sub-system failing the failure scanning operations, the host system determines whether the failed memory sub-system is extrinsically defective. A memory sub-system can be defective due to a hardware failure, firmware corruption, water damage, power issues, etc. Responsive to determining that all of the memory sub-systems that failed the failure scanning operations are defective, the host system removes the defective memory sub-systems from the initial set, and further modifies the trim values (e.g., increases the intensity of a voltage value, of a pulse duration, increase the number of active die, etc.). Responsive to determining that at least one of the memory sub-systems that failed the failure scanning operations is not extrinsically defective, the host system reverts to the set of trim values used in the seasoning operations prior to a non-defective memory sub-system failing the seasoning operation. This set of trim values can be classified as the tentative set of trim values for the particular set of form factors.

The host system can then apply seasoning operations using the tentative set of trim values to the remaining memory sub-systems in the calibration set. Responsive to the remaining memory sub-systems passing the seasoning operation (e.g., the host system determining that no memory sub-system satisfied criterion relating to failing failure scanning operations), the host system can store the trim values for further seasoning operations to be performed on subsequently manufactured memory sub-systems of the particular set of form factors. Responsive to at least one remaining memory sub-system failing the failure scanning operations, the host system determines whether the memory sub-system (s) that failed the failure scanning operations is extrinsically defective. A memory sub-system can be extrinsically defective due to a hardware failure, firmware corruption, water damage, power issues, etc. In some embodiments, the host system can run a test to determine whether the memory sub-system is extrinsically defective, such as determining whether the memory sub-system is able to boot up. Responsive to determining that all of the failed memory sub-systems being extrinsically defective, the host system stores the trim values for seasoning operations to be performed on subsequent manufactured memory sub-systems of the particular set of form factors. Responsive to determining that at least one of the memory sub-systems that failed the failure scanning operations is not defective, the host system generates another modified set of trim values by decreasing the intensity and/or duration of one or more of the tentative trim values or one or more modified trim values, and performing the seasoning operation on each of the remaining memory-systems of the calibration set of memory sub-systems until a final set of trim values is determined for further seasoning operations to be performed on subsequent manufactured memory sub-systems of the particular set of form factors.

Advantages of the present disclosure include, but are not limited to, the ability to generate different trim values correlating to seasoning operations to be performed on memory sub-systems having different form factors and identify the most appropriate seasoning trims for each form factor. This effectively improves yield by reducing a defect metric, such as defective parts per million (DPPM), and improves production throughput with an optimized seasoning duration. The seasoning process of the present disclosure can be used to generate calibrated seasoning operations for high-volume production of different types of memory sub-systems. Overall, embodiments of the present disclosure improve memory management to ensure data integrity.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a calibration component 113 that can be used to manage the loading of trim values for seasoning operations associated with memory device 130, 140, in accordance with embodiments of the present disclosure. The seasoning operations include transferring data from a host to the memory device during the write cycles, and transferring data from the memory device to the host for the read cycles. In some embodiments, calibration component 113 can be part of a memory sub-system 110 having one or more memory devices 130. In some embodiments, the memory sub-system controller 115 includes at least a portion of calibration component 113. For example, the memory sub-system controller 115 can include a processor 117 (processing device) configured to execute instructions stored in local memory 119 for performing the operations described herein. In some embodiments, calibration component 113 is part of the host system 120, an application, or an operating system. In other embodiment, local media controller 135 includes at least a portion of calibration component 113 and is configured to perform the functionality described herein.

In response to host system 120 issuing a seasoning operation request associated with a memory unit (e.g., a memory die) of the memory device 130, 140, the calibration component 113 can utilize data structures to identify a set of trim values associated with the requested operation. The data structures can specify the amount and type of trim values (e.g., pulse magnitude, pulses width, pulse intensity, pulse duration, write-to write delay, etc.) that are to be applied to the dies during the seasoning operation. The data structures can be sent, to the calibration component 113, by host system 120. The calibration component 113 can load the identified set of trim values to a register of the memory die to enable execution of the requested operation. In some embodiments, calibration component 113 perform a sequential trim loading process in response to the requested seasoning operation (e.g., load a first trim value of a sequence, load a second trim value of the sequence, and so forth). In some embodiments, calibration component 113 can store an indication that a trim value has been loaded (e.g., a bit value of '0' can denote a trim value has not yet been loaded and a bit value of '1' can denote a trim value has been loaded) in a corresponding data structure. When the memory sub-system 110 returns to an idle state (e.g., following the completion of all or a portion of the seasoning operation), the trim loading component 113 can use the bit values stored in the data structure to identify and continue the loading of any unloaded trim values (e.g., trim values that have not been previously loaded as part of either the sequential loading process or in response to a requested operation).

The host system 120 can include testing component 122. Testing component 122 be used to generate seasoning operations for a high volume production of memory sub-systems having the same or similar form factors, in accordance with embodiments of the present disclosure. In some embodiments, form factors can be similar when one or more form factors of one set of form factors varies, by a predetermined amount, from its corresponding form factor in another set of form factors. In some embodiments, testing component 122 can be part of host system 120. In some embodiments, testing component 122 is part of memory sub-system 110, an application, or an operating system. In some embodiments, the host system 120 can be operatively coupled to multiple memory sub-systems 110 to perform seasoning operations on each of the memory sub-systems in parallel. In other embodiments, the host system 120 can be operatively coupled to one memory sub-system at a time. Functions of the testing component will be described in greater detail below.

Figure 2:
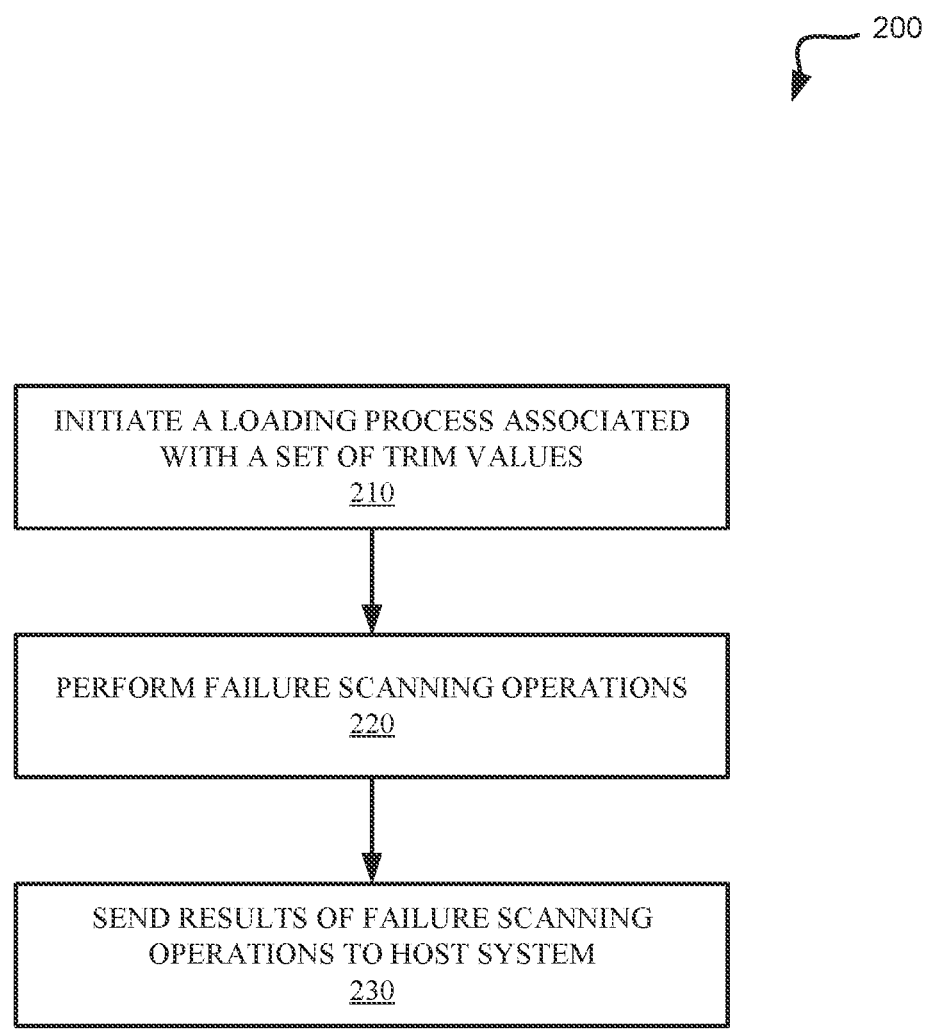
FIG. 2 illustrates a flow diagram of an example method of performing seasoning operations on a memory sub-system, in accordance with some embodiments of the present disclosure.

FIG. 2 is a flow diagram of an example method 200 of performing seasoning operations on a memory sub-system, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the calibration component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

In operation 210, in response to a seasoning operation command received from host system 120, the processing logic (e.g., a processing device of calibration component 113 of FIG. 1) initiates a loading process associated with a set of trim values and performs the seasoning operation. The trim values can specify different voltage pulse shapes (e.g., pulse magnitude, pulses width, etc.), intensity, duration, write-to write delay, etc. The loading process includes loading a sequence of the set of trim values to one or more registers of the memory sub-system. In some embodiments, the processing device can maintain one or more data structures (e.g., one or more tables) that identify the set of trim values (e.g., a complete set of the trim values associated with the memory sub-system). The processing logic can perform the seasoning operation by loading the trim values until the seasoning cycle criterion is satisfied. In some embodiments, the seasoning cycle criterion specifies the threshold number of seasoning cycles to be performed. In one example, the processing logic can instruct the local media controller of the memory device to apply a voltage pulse to a memory die at a specified voltage. In another example, the processing logic can instruct the local media controller of the memory device to apply a voltage pulse to a memory die of a specific duration. In another example, the local media controller can concurrently utilize a certain number of die.

At operation 220, responsive to the processing logic determining that the seasoning cycle criterion has been satisfied, the processing logic performs failure scanning operations. The failure scanning operations can involve various tests to collect functionality data of the memory device. For example, the processing logic can determine whether the memory device overheated during the seasoning process due to high temperature, whether the memory device failed to provide sufficient power to perform the seasoning operations, etc.

At operation 230, the processing logic sends the results of the failure scanning operations to the host system. For example, the processing logic can send generate a log file containing the results of the failure scanning operations, and send the log file to hosts system 120.

Figure 3:
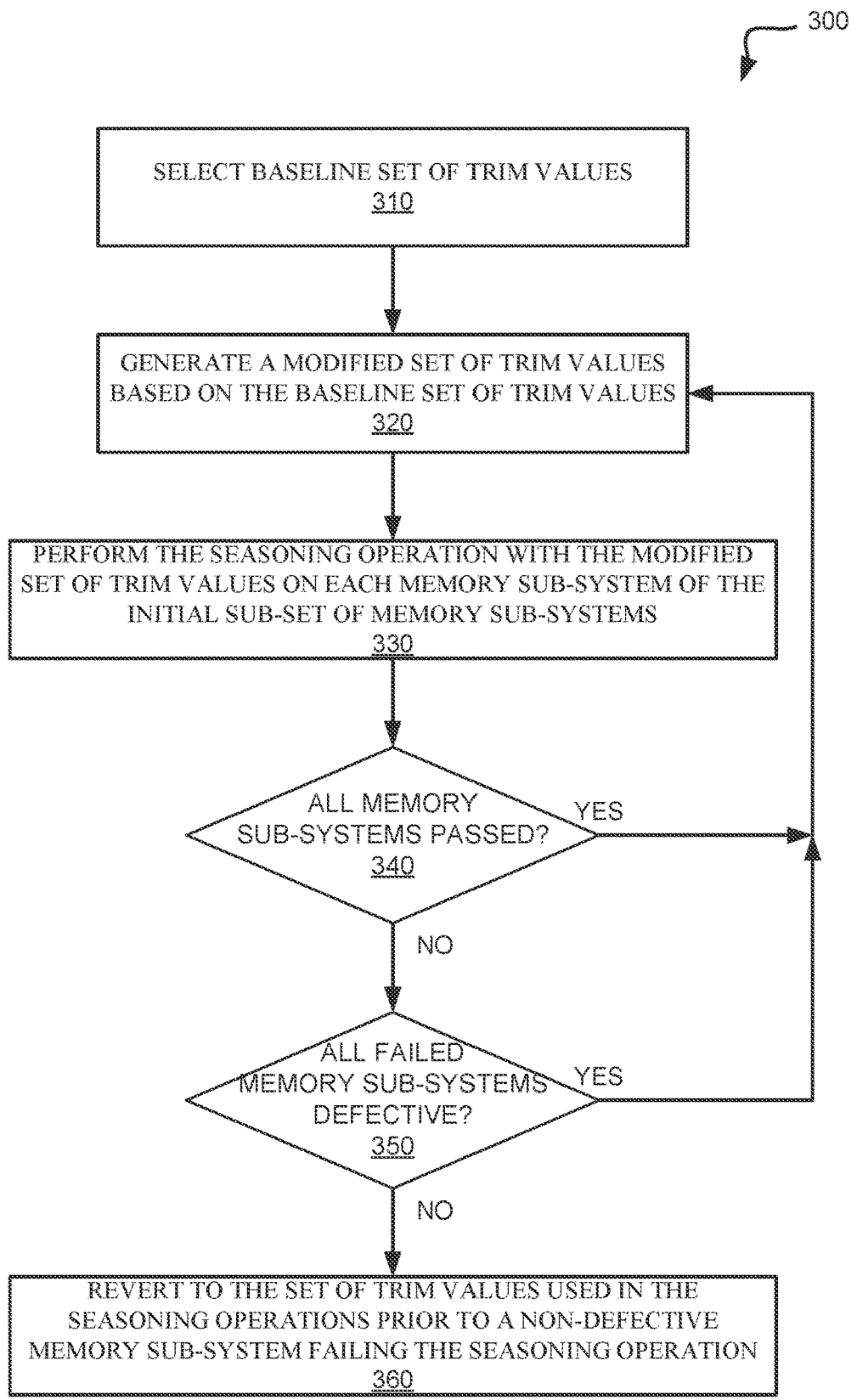
FIG. 3 illustrates a flow diagram of an example method of determining a tentative set of trim values for a set of form factors, in accordance with some embodiments of the present disclosure.

FIG. 3 is a flow diagram of an example method 300 of determining a tentative set of trim values for a set of form factors, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by testing component 122 of host system 120 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

Methods 300 and 400 (of FIG. 4) can include operations associated with generating a seasoning operation for a high volume production of memory sub-systems having the same or similar form factors. In particular, method 300 can be performed using an initial sub-set of a calibration set of memory sub-systems having the same or similar form factors, while method 400 can be performed using the remainder of the calibration set of memory sub-systems. The finalized seasoning trims generated using method 300 and 400 can be used in seasoning operations for subsequent memory sub-systems having the same of similar form factors as the calibration set of memory sub-systems.

At operation 310, processing logic selects a baseline set of trim values. The baseline set of trim values can include a set of predetermined trim values that will not cause power related or temperature related failures in memory sub-systems having similar or the same form factors. In some embodiments, the processing logic can select the baseline set of trim values from a data structure received from host system 120. For example, the baseline set of trim values can be a predetermined set of trim values previously defined during prior seasoning operations.

At operation 320, the processing logic generates a modified set of trim values based on the baseline set of trim values. In particular, the processing logic can increase the intensity and/or duration of one or more of the baseline trim values. In some embodiments, the processing logic can increase the intensity and/or duration of one or more of the baseline values by a predetermined amount or percentage. For example, the processing logic can increase (by a certain predefined amount or a certain percentage) a voltage value of the voltage pulse applied to a memory die of a memory sub-system (e.g., apply a voltage pulse at a higher voltage than a baseline trim value), etc. In some embodiments, the processing logic performs a round-robin scheme and increases, during each execution of operation 320, each trim value one by one.

At operation 330, the processing logic performs the seasoning operations with the modified set of trim values on each memory sub-system 110 of the initial sub-set of memory sub-systems. For example, the processing logic can send a seasoning operation command to each of the memory sub-systems. Responsive to receiving the seasoning operation command, each memory sub-system can load, from a data structure specified by the seasoning operation command, an identified set of voltage pulses to a register of a memory die to enable execution of the requested operation. In some embodiments, the seasoning operations can be similar or the same as described in method 200.

At operation 340, the processing logic determines whether each memory sub-system of the initial set of memory sub-systems passed the failure scanning operations. In some embodiments, a memory sub-system passes the failure scanning operations when the memory sub-system does not experience a temperature or a power related failure during the failure scanning operations. Responsive to each memory sub-system of the initial calibration set passing the failure scanning operations, the processing logic proceeds to operation 320, and generates another modified set of trim values by further increasing the intensity and/or duration of one or more of the baseline trim values or one or more modified trim values. The processing logic then proceeds to perform the seasoning operations with the new modified set of trim values on each memory sub-system 110 of the initial sub-set of memory sub-systems. Responsive to at least one memory sub-system of the initial calibration set failing the failure scanning operations (e.g., overheating by high temperature, drive cannot provide sufficient power to do seasoning, etc.), the processing device proceeds to operation 350.

At operation 350, the processing logic determines whether the memory sub-system(s) that failed the failure scanning operations is extrinsically defective. A memory sub-system can be extrinsically defective due to a hardware failure, soldering issues, power supply issues, missing or malfunctioning electronic modules and components, firmware corruption, water damage, etc. In some embodiments, the processing logic can run a test to determine whether the memory sub-system is extrinsically defective. For example, the testing component 122 can run a test to determine whether the memory sub-system is able to boot up. In some embodiments, the processing logic can receive a command from a user interface indicating that the memory sub-system is extrinsically defective. Any extrinsically defective memory sub-system can be removed from the initial set of memory sub-systems. Responsive to determining that all of the memory sub-systems that failed the failure scanning operations are extrinsically defective, the processing logic proceeds to operation 320, and generates another modified set of trim values by further increasing the intensity and/or duration of one or more of the baseline trim values or one or more modified trim values. The processing logic then proceeds to perform the seasoning operation with the new modified set of trim values on each memory sub-system 110 of the initial sub-set of memory sub-systems. Responsive to determining that at least one of the memory sub-systems that failed the failure scanning operations is not defective, the processing logic proceeds to operation 360.

At operation 360, the processing logic reverts to the set of trim values used in the seasoning operations prior to a non-defective memory sub-system failing the seasoning operation. This set of trim values can be stored as the tentative set of trim values for the particular set of form factors, and is further discussed in method 400 of FIG. 4. In some embodiments, the processing logic can use a search algorithm to perform at least a portion of method 300 to determine the tentative set of trim values. For example, staring from the baseline trim values, the processing logic can use a search algorithm (e.g., a binary search algorithm) to determine the tentative set of trim values. A binary search can start seasoning with a "middle" set of trim values which are the average of baseline trims (lower bound, safe but long seasoning duration) and another set of trims (upper bounds) that will cause seasoning failure (such as drive overheating, insufficient drive power to do seasoning, etc.). Responsive to the seasoning failing with "middle" the set of trims, the processing logic can set the current "middle" set of trims as new upper bound set of trims. Otherwise, the processing logic can set the current "middle" set of trims as the new lower bound. After lower and upper bounds are updated, the processing logic can generate a new "middle" set of trims and perform a new round of seasoning. The processing logic can repeat this process until a tentative set of trim values is generated. In some embodiments, other algorithms can be used to determine the tentative set of trim values.

In some embodiments, the processing logic can decrease the intensity and/or duration of at least one of trim values of the tentative set to create a safety margin. The safety margin can be percentage-based, amount-based, etc. For example, one the processing logic determines the tentative set of trim values, the processing logic can decrease the intensity and/or duration of one or more of the trim values of the tentative set by a predetermined percentage, a predetermined amount, etc. In some embodiments, different trim values can be correlated to different safety margins. For example, the voltage value of the voltage pulse can be decreased by one percentage while the voltage value of the voltage pulse can be decreased by another percentage.

Figure 4:
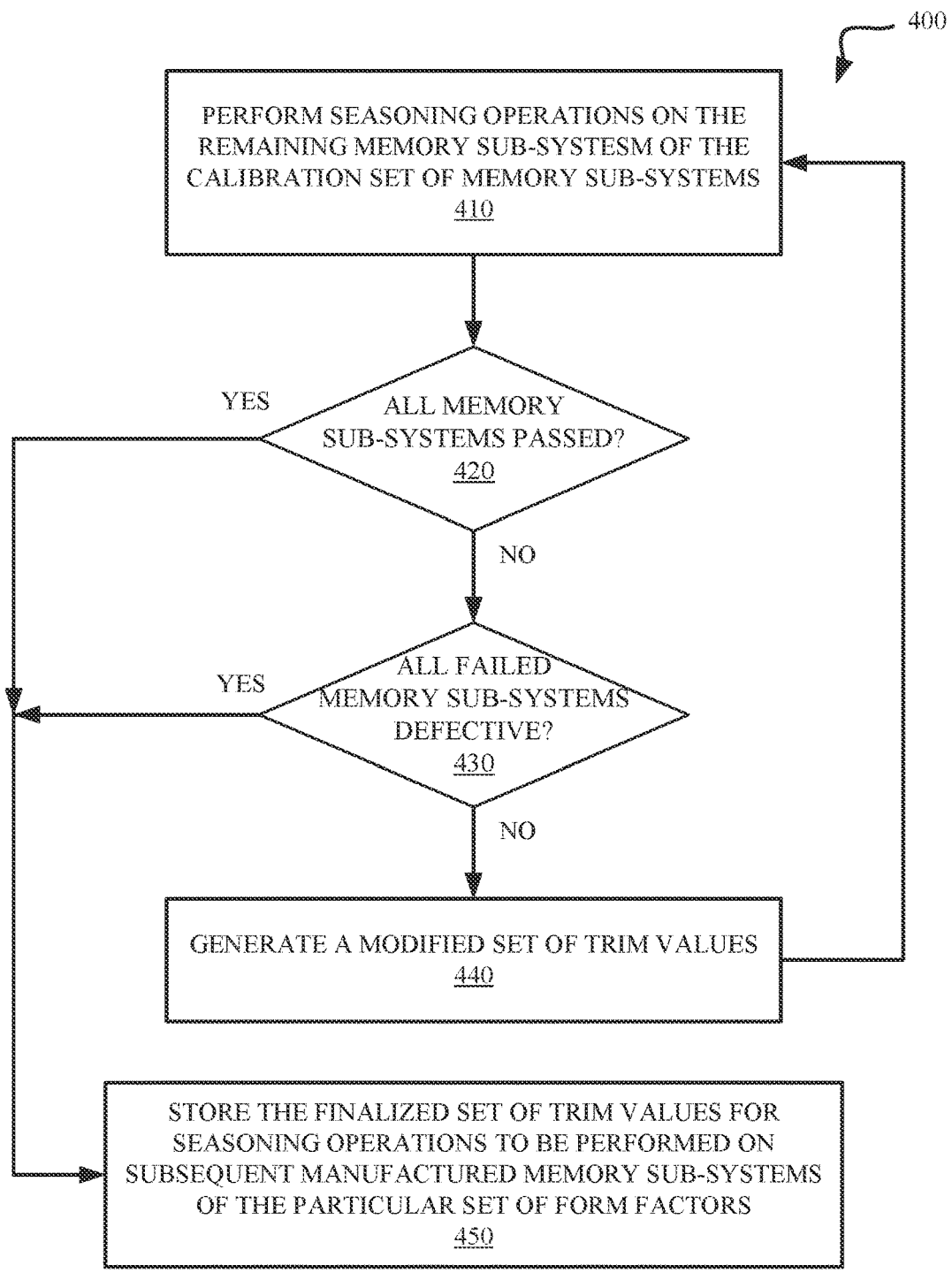
FIG. 4 illustrates a flow diagram of an example method flow of determining a final set of trim values for a set of form factors, in accordance with some embodiments of the present disclosure.

FIG. 4 is a flow diagram of an example method 400 of determining a final set of trim values for a set of form factors, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by testing component 122 of host system 120 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 410, the processing logic performs the seasoning operations using the tentative set of trim values on each of the remaining memory-systems of the calibration set of memory sub-systems. For example, the processing logic can send a seasoning operation command to each of the remaining memory sub-systems. In response to receiving the seasoning operation command, each memory sub-system can initiate a loading process associated with a set of tentative trim values and perform the seasoning operation. In some embodiments, the seasoning operations can be similar or the same as described in method 200.

At operation 420, the processing logic determines whether each memory sub-system of remaining memory sub-systems passed the failure scanning operations associated with the seasoning operations. In some embodiments, a memory sub-system passes the failure scanning operations if the memory sub-system does not experience temperature related or power related failures during the failure scanning operations. Responsive to each remaining memory sub-system passing the failure scanning operations, the processing logic proceeds to operation 450. Responsive to at least one remaining memory sub-system failing the failure scanning operations, the processing device proceeds to operation 430.

At operation 430, the processing logic determines whether the memory sub-system(s) that failed the failure scanning operations is extrinsically defective. Responsive to determining that at least one of the memory sub-systems that failed the failure scanning operations is not extrinsically defective, the processing logic proceeds to operation 440.

At operation 440, the processing logic generates another modified set of trim values by decreasing the intensity and/or duration of one or more of the tentative trim values or one or more modified trim values. For example, the processing logic can decrease a voltage value of the voltage pulse applied to a memory die of a memory sub-system (e.g., apply a voltage pulse at a lower voltage than a trim value of the tentative set), a number of die concurrently active during the seasoning operation, etc. The processing logic then proceeds to perform the seasoning operation with the new modified set of trim values on each memory sub-system 110 of the remaining memory sub-systems of the calibration set of memory sub-systems. Responsive to determining that all of the memory sub-systems that failed the failure scanning operations are extrinsically defective, the processing logic proceeds to operation 450.

At operation 450, the processing logic stores the finalized set of trim values for seasoning operations to be performed on subsequent manufactured memory sub-systems of the particular set of form factors. For example, the finalized set of trim values can be stored in a data structure, and performed on each memory sub-system (of the same or similar form factors) manufactured during a high volume production. In some embodiments, the processing logic can decrease the intensity and/or duration of at least one of the trim values of the finalized set to create a safety margin. For example, the processing logic can decrease the intensity and/or duration of at least one of trim values of the finalized set by a predetermined percentage, a predetermined quality, etc.

Figure 5:
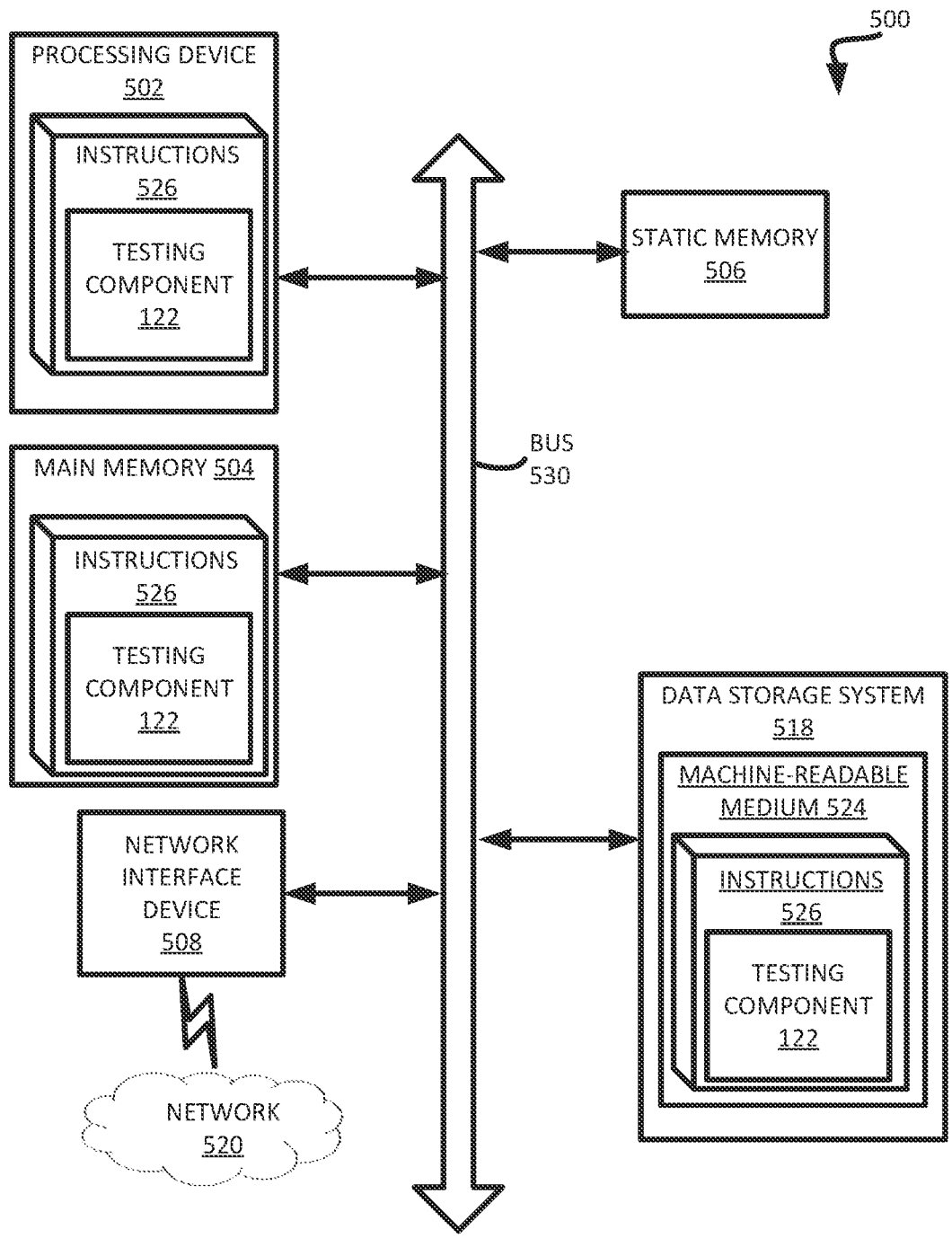
FIG. 5 illustrates a block diagram of an example computer system in which implementations of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to testing component 122 and/or calibration component 113 (not shown) of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530. Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to testing component 122 and/or calibration component 113 (not shown) of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   selecting, by a processor, a baseline set of trim values based on a set of memory sub-system form factors;
   generating a first modified set of trim values for seasoning operations by modifying a first trim value of the baseline trim values;
   causing each memory sub-system of a plurality of memory sub-systems to perform seasoning operations using the first modified set of trim values;
   responsive to determining that a memory sub-system of the plurality of memory sub-system failed to satisfy a predetermined criterion, determining whether the memory sub-system is extrinsically defective;
   responsive to determining that the memory sub-system is extrinsically defective, removing the extrinsically defective memory sub-system from the set of memory sub-systems; and
   generating a second modified set of trim values for seasoning operations by modifying a second trim value of the first modified set of trim values.

2. The method of claim 1, further comprising:
   responsive to determining that the memory sub-system is not extrinsically defective, reverting to a previously selected set of trim values.

3. The method of claim 1, wherein generating a modified set of trim values comprises at least one of increasing a voltage value of the voltage pulse applied to a memory die of a memory sub-system, increasing a pulse duration, or increasing a number of active die in the memory device.

4. The method of claim 1, further comprising:
   causing each memory sub-system of another plurality of memory sub-systems to perform seasoning operations using the first modified set of trim values; and
   responsive to determining that each memory sub-system of the another plurality of memory sub-systems satisfied the predetermined criterion, storing the first set of trim values to be applied to memory sub-systems having similar or the same form factors as the another plurality of memory sub-systems.

5. The method of claim 1, further comprising:
   responsive to determining that a memory sub-system of the plurality of memory sub-systems failed to satisfy the predetermined criterion, instructing each memory sub-system of another plurality of memory sub-systems to perform seasoning operations comprising the baseline set of trim values.

6. The method of claim 1, further comprising:
decreasing at least one of the intensity or duration of at least on the trim values of the first set of trim value to create a safety margin.

7. The method of claim 1, wherein a memory sub-system satisfies the predetermined criterion when the memory sub-system does not overheat during the seasoning process and is able to provide sufficient power to perform the seasoning operations.

8. A system comprising:
a plurality of memory sub-systems; and
a processing device, operatively coupled to the plurality of memory sub-systems, to perform seasoning operations for each of the plurality of memory sub-systems, the seasoning operations comprising:
selecting, by a processor, a baseline set of trim values based on a set of memory sub-system form factors;
generating a first modified set of trim values for seasoning operations by modifying a first trim value of the baseline trim values;
causing each memory sub-system of a plurality of memory sub-systems to perform seasoning operations using the first modified set of trim values;
responsive to determining that a memory sub-system of the plurality of memory sub-system failed to satisfy a predetermined criterion, determining whether the memory sub-system is extrinsically defective;
responsive to determining that the memory sub-system is extrinsically defective, removing the extrinsically defective memory sub-system from the set of memory sub-systems; and
generating a second modified set of trim values for seasoning operations by modifying a second trim value of the first modified set of trim values.

9. The system of claim 8, wherein the operations further comprise:
responsive to determining that the memory sub-system is not extrinsically defective, reverting to a previously selected set of trim values.

10. The system of claim 8, wherein the operations further comprise:
wherein generating a modified set of trim values comprises at least one of increasing a voltage value of the voltage pulse applied to a memory die of a memory sub-system, increasing a pulse duration, or increasing a number of active die in the memory device.

11. The system of claim 8, wherein the operations further comprise:
causing each memory sub-system of another plurality of memory sub-systems to perform seasoning operations using the first modified set of trim values; and
responsive to determining that each memory sub-system of the another plurality of memory sub-systems satisfied the predetermined criterion, storing the first set of trim values to be applied to memory sub-systems having similar or the same form factors as the another plurality of memory sub-systems.

12. The system of claim 8, wherein the operations further comprise:
responsive to determining that a memory sub-system of the plurality of memory sub-systems failed to satisfy the predetermined criterion, instructing each memory sub-system of another plurality of memory sub-systems to perform seasoning operations comprising the baseline set of trim values.

13. The system of claim 8, wherein the operations further comprise:
decreasing at least one of the intensity or duration of at least on the trim values of the first set of trim value to create a safety margin.

14. The system of claim 8, wherein a memory sub-system satisfies the predetermined criterion when the memory sub-system does not overheat during the seasoning process and is able to provide sufficient power to perform the seasoning operations.

15. A non-transitory computer readable medium comprising instructions, which when executed by a processing device, cause the processing device to perform operations comprising:
selecting a baseline set of trim values based on a set of memory sub-system form factors;
generating a first modified set of trim values for seasoning operations by modifying a first trim value of the baseline trim values;
causing each memory sub-system of a plurality of memory sub-systems to perform seasoning operations using the first modified set of trim values;
responsive to determining that a memory sub-system of the plurality of memory sub-system failed to satisfy a predetermined criterion, determining whether the memory sub-system is extrinsically defective;
responsive to determining that the memory sub-system is extrinsically defective, removing the extrinsically defective memory sub-system from the set of memory sub-systems; and
generating a second modified set of trim values for seasoning operations by modifying a second trim value of the first modified set of trim values.

16. The non-transitory computer readable medium of claim 15, wherein the operations further comprise:
responsive to determining that the memory sub-system is not extrinsically defective, reverting to a previously selected set of trim values.

17. The non-transitory computer readable medium of claim 15, wherein generating a modified set of trim values comprises at least one of increasing a voltage value of the voltage pulse applied to a memory die of a memory sub-system, increasing a pulse duration, or increasing a number of active die in the memory device.

18. The non-transitory computer readable medium of claim 15, wherein the operations further comprise:
causing each memory sub-system of another plurality of memory sub-systems to perform seasoning operations using the first modified set of trim values; and
responsive to determining that each memory sub-system of the another plurality of memory sub-systems satisfied the predetermined criterion, storing the first set of trim values to be applied to memory sub-systems having similar or the same form factors as the another plurality of memory sub-systems.

19. The non-transitory computer readable medium of claim 15, wherein the operations further comprise:
responsive to determining that a memory sub-system of the plurality of memory sub-systems failed to satisfy the predetermined criterion, instructing each memory sub-system of another plurality of memory sub-systems to perform seasoning operations comprising the baseline set of trim values.

20. The non-transitory computer readable medium of claim 15, wherein the operations further comprise:
  decreasing at least one of the intensity or duration of at least on the trim values of the first set of trim value to create a safety margin.

\* \* \* \* \*